United States Patent
Wu et al.

(10) Patent No.: US 8,936,891 B2
(45) Date of Patent: Jan. 20, 2015

(54) PHOTOSENSITIVE POLYSILOXANE COMPOSITION AND USES THEREOF

(71) Applicant: Chi Mei Corporation, Tainan (TW)

(72) Inventors: Ming-Ju Wu, Tainan (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 14/133,277

(22) Filed: Dec. 18, 2013

(65) Prior Publication Data
US 2014/0178822 A1    Jun. 26, 2014

(30) Foreign Application Priority Data

Dec. 25, 2012   (TW) .............................. 101149666 A

(51) Int. Cl.
| | | |
|---|---|---|
| G03F 7/023 | (2006.01) | |
| G03F 7/027 | (2006.01) | |
| G03F 7/075 | (2006.01) | |
| G03F 7/038 | (2006.01) | |

(52) U.S. Cl.
CPC .............. *G03F 7/038* (2013.01); *G03F 7/0752* (2013.01); *G03F 7/027* (2013.01); *G03F 7/0233* (2013.01)

USPC ............. 430/18; 430/165; 430/191; 430/192; 430/193; 430/270.1

(58) Field of Classification Search
CPC ...... G03F 7/0233; G03F 7/027; G03F 7/0752
USPC ................. 430/18, 165, 191, 192, 193, 270.1
See application file for complete search history.

(56) References Cited

U.S. PATENT DOCUMENTS 6,534,235 B1 *  3/2003  Hanabata et al. ............. 430/191
7,115,673 B2 * 10/2006  Mochizuki et al. ........... 522/164

FOREIGN PATENT DOCUMENTS

JP       2008-107529       5/2008

* cited by examiner

*Primary Examiner* — John Chu
(74) *Attorney, Agent, or Firm* — WPAT, P.C.; Anthony King

(57) ABSTRACT

The invention relates to a photosensitive polysiloxane composition that has good thermal transmittance, good chemical resistance and good sensitivity and good refractivity. The invention also provides a method for forming a thin film on a substrate, a thin film on a substrate and an apparatus.

18 Claims, No Drawings

PHOTOSENSITIVE POLYSILOXANE COMPOSITION AND USES THEREOF

BACKGROUND OF THE INVENTION

1. Field of the Invention

The invention relates to a photosensitive polysiloxane composition and a film and apparatus formed thereby; particularly, to a photosensitive polysiloxane composition for producing a product having good sensitivity and refractivity.

2. Description of the Related Art

In recent years, along with the shrinking size, the requirement of pattern miniaturization in lithography increases more highly in the semiconductor industry, liquid crystal display or organic light-emitting diode display and other areas. In this art, the pattern miniaturization is obtained by exposure and development of positive photosensitive materials with high resolution and sensitivity. Among them, a positive photosensitive material comprising a polysiloxane polymer is used as the mainstream in this art.

Japanese Patent Publication No. 2008-107529 discloses a photosensitive polysiloxane composition able to form a high transparent cured film. The composition comprises a polysiloxane polymer, a quinonediazido acid ester and a solvent. The polysiloxane polymer contains an oxetanyl group or a succinic anhydride group, and is obtained by hydrolyzing and partial condensing siloxane monomers including an oxetanyl group or a succinic anhydride group. The polysiloxane forms a hydrophilic structure via ring-opening reaction in copolymerization, and has high solubility in an alkaline developer. However, the photosensitive polysiloxane fails to meet the requirement of the increasing sensitivity and refractivity in the modern industry.

Therefore, improving the sensitivity and refractivity at the same time to meet the modern requirements is a target remained to be achieved in the technical field of the present invention.

SUMMARY OF THE INVENTION

First thing to note is that, as used herein, (meth)acrylic acid represents acrylic acid and/or methacrylic acid; (meth)acryloyl represents acryloyl and/or methacryloyl; (meth)acrylate means acrylate and/or methacrylate.

In the present invention, the specific contents of urethane (metha)acrylate compound and inorganic particles are provided to obtain a photosensitive polysiloxane composition having high sensitivity and refractivity.

Therefore, the invention relates to a photosensitive polysiloxane composition comprising:
  a polysiloxane polymer (A);
  an ortho-naphthoquinone diazide sulfonic acid ester (B);
  an urethane(metha)acrylate compound (C), wherein the urethane(metha)acrylate compound (C) comprises at least six (meth)acryloyl groups in one molecule;
  inorganic particles (D), wherein the Group IV element oxide is a main component of the inorganic particles (D); and
  a solvent (E).

The present invention also provides a method for forming a film on a substrate comprising applying the photosensitive polysiloxane composition as mentioned above on the substrate.

The present invention also provides a film on a substrate, which is obtained by the method as mentioned above.

The present invention further provides an apparatus comprising the film as mentioned above.

DETAILED DESCRIPTION OF THE INVENTION

The invention relates to a photosensitive polysiloxane composition comprising:
  a polysiloxane polymer (A);
  an ortho-naphthoquinone diazide sulfonic acid ester (B);
  an urethane(metha)acrylate compound (C), wherein the urethane(metha)acrylate compound (C) comprises at least six (meth)acryloyl groups in one molecule;
  inorganic particles (D), wherein the Group IV element oxide is a main component of the inorganic particles (D); and
  a solvent (E).

There is no specific limitation to the structure of the polysiloxane polymer (A). In one preferred embodiment of the invention, the polysiloxane polymer (A) is obtained by hydrolyzing and condensing a silane compound and/or a polysiloxane; preferably, by partially condensing.

In one preferred embodiment of the invention, the silane compound includes but is not limited to a structure represented by Formula (1);

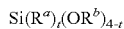  Formula (1)

wherein:
  $R^a$ is independently selected from the group consisting of a hydrogen atom, a $C_1$-$C_{10}$ alkyl group, a $C_2$-$C_{10}$ alkenyl group, and a $C_6$-$C_{15}$ aryl group, an anhydride-substituted $C_1$-$C_{10}$ alkyl group, and an epoxy-substituted alkoxy group;
  $R^b$ is independently selected from the group consisting of a hydrogen atom, a $C_1$-$C_6$ alkyl group, a $C_1$-$C_6$ acyl group, and a $C_6$-$C_{15}$ aryl group; and
  t represents an integer from 0 to 3, and wherein when t is 2 or 3, the plural $R^a$s are identical with or different from each other; and wherein when 4-t is 2 or 3, the plural $R^b$s are identical with or different from each other.

In the definition of $R^a$, the $C_1$-$C_{10}$ alkyl group includes, but is not limited to, methyl, ethyl, n-propyl, isopropyl, n-butyl, tert-butyl, n-hexyl, n-decyl, trifluoromethyl, 3,3,3-trifluoropropyl, 3-aminopropyl, 3-mercaptopropyl, or 3-isocyanatopropyl; the $C_2$-$C_{10}$ alkenyl group includes, but is not limited to, vinyl, 3-acryloxypropyl or 3-methacryloxypropyl; and the $C_6$-$C_{15}$ aryl group includes, but is not limited to, phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy) pentyl, or naphthyl.

Examples of the anhydride-substituted $C_1$-$C_{10}$ alkyl group include, but are not limited to, ethyl succinic anhydride, propyl succinic anhydride, and propyl glutaric anhydride.

Examples of the epoxy-substituted $C_1$-$C_{10}$ alkyl group include, but are not limited to, oxetanylpentyl, and 2-(3,4-epoxycyclohexyl)ethyl.

Examples of the epoxy-substituted alkoxy group include, but are not limited to, glycidoxypropyl, and 2-oxetanylbutoxy.

In the definition of $R^b$, examples of the $C_1$-$C_6$ alkyl group include, but are not limited to, methyl, ethyl, n-propyl, isopropyl, and n-butyl. A non-limiting example of the $C_1$-$C_6$ acyl group is acetyl. A non-limiting example of the $C_6$-$C_{15}$ aryl group is phenyl.

In the compound represented by Formula (1), t represents an integer from 0 to 3. When t denotes 0, the silane compound represents a tetrafunctional silane; when t denotes 1, the silane compound represents a trifunctional silane; when t denotes 2, the silane compound represents a difunctional silane; when t denotes 3, the silane compound represents a monofunctional silane.

In one preferred embodiment of the invention, the silane compound includes, but is not limited to, (1) tetrafunctional silane; such as tetramethoxysilane, tetraethoxysilane, tetraacetoxysilane, tetraphenoxy silane; (2) trifunctional silane; such as methyltrimethoxysilane (referred to as MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryoyloxypropyltrimethoxysilane, 3-methylacryloyloxypropyltrimethoxysilane, 3-methylacryloyloxypropyltriethoxysilane, phenyltrimethoxysilane (referred to as PTMS), phenyltriethoxysilane (referred to as PTES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 3-mercaptopropyltrimethoxysilane, 3-ethyl-3-[[3-(triphenoxysilyl)propoxy)methyl]oxetane, 3-ethyl-3-[[3-(trimethoxysilyl)propoxy)methyl]oxetane (trade name of TMSOX-D, manufactured by Toagosei Company, Limited), 3-ethyl-3-[[3-(triethoxysilyl) propoxy)methyl]oxetane (trade name of TESOX-D, manufactured by Toagosei Company, Limited), 2-(trimethoxysilyl)ethyl succinic anhydride, 3-triphenoxysilyl propyl succinic anhydride, 3-trimethoxysilyl propyl succinic anhydride (trade name of X-12-967, manufactured by Shin-Etsu Chemical Co., Ltd.), 3-(triethoxysilyl) propyl succinic anhydride (trade name of GF-20, manufactured by WACKER), 3-(trimethoxysilyl) propyl glutaric anhydride (trade name of TMSG, manufactured by WACKER), 3-(triethoxysilyl) propyl glutaric anhydride, 3-(triphenoxysilyl) propyl glutaric anhydride; (3) difunctional silane; such as dimethyldimethoxysilane (referred to as DMDMS), dimethyldiethoxysilane, dimethyldiacetyloxysilane, di-n-butyldimethoxysilane, diphenyldimethoxysilane, diisopropoxy-di(2-oxetanylbutoxypropyl) silane (referred to as DIDOS), di(3-oxetanylpentyl)dimethoxy silane, (di-n-butoxysilyl)di(propyl succinic anhydride), (dimethoxysilyl)di (ethyl succinic anhydride); (4) monofunctional silane; such astrimethylmethoxysilane, tri-n-butylethoxysilane, 3-glycidoxypropyldimethylmethoxysilane, 3-glycidoxypropyldimethylethoxysilane, di(2-oxetanylbutoxypentyl)-2-oxetanylpentylethoxy silane, tri(2-oxetanylpentyl)methoxy silane, (phenoxysilyl)tri(propyl succinic anhydride), (methoxysilyl)di(ethyl succinic anhydride). The aforesaid examples of the silane compound can be used alone or as a mixture of two or more.

In one another preferred embodiment of the invention, the polysiloxane includes but is not limited to a structure represented by Formula (2);

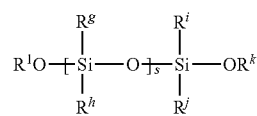

Formula (2)

wherein:

$R^g$, $R^h$, $R^i$, and $R^j$ are identical with or different from each other, and represent, respectively and independently, a hydrogen atom, a $C_1$-$C_{10}$ alkyl group, a $C_2$-$C_6$ alkenyl group, or a $C_6$-$C_{15}$ aryl group; wherein the alkyl group, alkenyl group or aryl group preferably contains a substituent;

s represents an integer ranging from 1 to 1,000; preferably from 3 to 300; and more preferably from 5 to 200.

When s represents an integer from 2 to 1,000, the plural $R^c$s and $R^d$s can be respectively identical with or different from each other. Examples of the alkyl group include, but are not limited to, methyl, ethyl, n-propyl, or the like. Examples of the alkenyl group include, but are not limited to, vinyl, acryloxypropyl, methacryloxypropyl, or the like. Examples of the aryl group include, but are not limited to, phenyl, tolyl, naphthyl, or the like.

$R^l$ and $R^k$ represent, respectively and independently, a hydrogen atom, a $C_1$-$C_6$ alkyl group, a $C_1$-$C_6$ acyl group, or a $C_6$-$C_{15}$ aryl group; wherein the alkyl group, acyl group or aryl group preferably contains a substituent. Examples of the alkyl group include, but are not limited to, methyl, ethyl, n-propyl, isopropyl, n-butyl, or the like. Examples of the acyl group include, but are not limited to, acetyl, or the like. Examples of the aryl group include, but are not limited to, phenyl, or the like.

Examples of the polysiloxane represented by Formula (2) include, but are not limited to, 1,1,3,3-tetramethyl-1,3-dimethoxydisiloxane, 1,1,3,3-tetramethyl-1,3-diethoxydisiloxane, 1,1,3,3-tetraethyl-1,3-diethoxydisiloxane, commercially available silanol terminal siloxane prepolymers manufactured by Gelest Inc. for example, DM-S12 (molecular weight: 400-700), DMS-S15 (molecular weight: 1,500-2,000), DMS-S21 (molecular weight: 4,200), DMS-S27 (molecular weight: 18,000), DMS-S31 (molecular weight: 26,000), DMS-S32 (molecular weight: 36,000), DMS-S33 (molecular weight: 43,500), DMS-S35 (molecular weight: 49,000), DMS-S38 (molecular weight: 58,000), DMS-S42 (molecular weight: 77,000), PDS-9931 (molecular weight: 1,000-1,400), or the like. The aforesaid examples of the siloxane prepolymer can be used alone or as a mixture of two or more.

When the silane compound and the polysiloxane are used in combination, there is no specific limitation to the mixing ratio thereof. Preferably, the molar ratio of the silane compound and the siloxane prepolymer in Si atom ranges from 100:0.01 to 50:50.

In one another preferred embodiment of the invention, besides of obtained by hydrolyzing and condensing a silane compound and/or a polysiloxane, the polysiloxane polymer (A) can also be prepared via a copolymerization by mixing the silane compound and/or polysiloxane with silicon dioxide particles. There is no specific limitation to the mean particle size of the silicon dioxide particles. The mean particle size of the silicon dioxide particles ranges generally from 2 nm to 250 nm, preferably from 5 nm to 200 nm, and more preferably from 10 nm to 100 nm.

Examples of the silicon dioxide particles include commercially available products manufactured by Catalysts and Chemicals Ltd., for example, OSCAR 1132 (particle size: 12 nm, dispersant: methanol), OSCAR 1332 (particle size: 12 nm, dispersant: n-propanol), OSCAR 105 (particle size: 60 nm, dispersant: γ-butyrolactone), OSCAR 106 (particle size: 120 nm, dispersant: diacetone alcohol), or the like; commercially available products manufactured by Fuso Chemical Co., Ltd., for example, Quartron PL-1-IPA (particle size: 13 nm, dispersant: isopropanone), Quartron PL-1-TOL (particle size: 13 nm, dispersant: toluene), Quartron PL-2L-PGME (particle size: 18 nm, dispersant: propylene glycol monomethyl ether), Quartron PL-2L-MEK (particle size: 18 nm, dispersant: methyl ethyl ketone), or the like; commercially available products manufactured Nissan Chemical, for example, IPA-ST (particle size: 12 nm, dispersant: isopropanol), EG-ST (particle size: 12 nm, dispersant: ethylene glycol), IPA-ST-L (particle size: 45 nm, dispersant: isopropanol), IPA-ST-ZL (particle size: 100 nm, dispersant: isopropanol), or the like. The aforesaid silicon dioxide particles can be used alone or as a mixture of two or more.

There is no specific limitation to the amounts when mixing the silicon dioxide particles with the silane compound and/or the polysiloxane. Preferably, the molar ratio of the silicon dioxide particles to the polysiloxane polymer (A) in Si atom ranges from 1% to 50%.

The condensation can be conducted in a manner well known in the art. For example, a solvent, water, and optionally a catalyst are added to the silane compound and/or the polysiloxane, followed by stirring at a temperature ranging from 50° C. to 150° C. for 0.5 hour to 120 hours. During stirring, the by-products, such as alcohols, water, and the like, can be removed by distillation, if necessary.

There is no specific limitation to the solvent of synthesizing the polysiloxane polymer (A), which can be identical with the solvent (E) as mentioned below. The solvent is used in an amount ranging generally from 15 wt % to 1200 wt %, preferably from 20 wt % to 1100 wt %; more preferably from 30 wt % to 1000 wt %, based on 100 wt % of the total organic silane compound and/or the polysiloxane. When water is applied as the solvent, the amount of water for the hydrolysis ranges from 0.5 to 2 moles based on 1 mole of the hydrolysable groups contained in the mixture.

There is no specific limitation to the catalyst optionally added in the synthesis of the polysiloxane polymer (A), and an acid catalyst or a base catalyst can be preferably used. Examples of the acid catalyst include hydrochloric acid, nitric acid, sulfuric acid, hydrofluoric acid, oxalic acid, phosphoric acid, acetic acid, trifluoroacetic acid, formic acid, polycarboxylic acids and anhydrides thereof, and ion exchange resin. Examples of the base catalyst include diethylamine, triethylamine, tripropylamine, tributylamine, tripentylamine, trihexylamine, triheptylamine, trioctylamine, diethanolamine, triethanolamine, sodium hydroxide, potassium hydroxide hydrate, compounds containing an amino group, and ion exchange resin.

Preferably, the catalyst is used in an amount ranging generally from 0.005 wt % to 15 wt %, preferably from 0.01 wt % to 12 wt %; more preferably from 0.05 wt % to 10 wt %, based on 100 wt % of the total silane compound and/or the polysiloxane.

In view of stability, it is preferable that the by-products (for example, alcohols or water) and the catalyst are not contained in polysiloxane polymer (A) produced after hydrolysis and condensation. Therefore, purification is carried out if necessary. There is no specific limitation to the purification method. Preferably, the polysiloxane polymer (A) is diluted with a hydrophobic solvent, and the organic layer washed with water several times is then concentrated with an evaporator to remove alcohols and water. Additionally, the catalyst can be removed using ion exchange resin or using the wash with water as mentioned above.

There is no specific limitation to the ortho-naphthoquinone diazide sulfonic acid ester (B) suitable in the photosensitive polysiloxane composition of the present invention. The ortho-naphthoquinone diazide sulfonic acid ester (B) can be a fully or partially esterified compound. Preferably, the ortho-naphthoquinone diazide sulfonic acid ester (B) is obtained via a reaction of o-naphthoquinonediazidesulfonic acid or salt thereof with a hydroxyl compound. More preferably, the ortho-naphthoquinone diazide sulfonic acid ester (B) is obtained via a reaction of o-naphthoquinonediazidesulfonic acid or salt thereof with a polyhydroxyl compound.

Examples of the o-naphthoquinonediazidesulfonic acid include, but are not limited to, o-naphthoquinonediazide-4-sulfonic acid, o-naphthoquinonediazide-5-sulfonic acid, and o-naphthoquinonediazide-6-sulfonic acid. A non-limiting example of the salt of o-naphthoquinonediazide sulfonic acid is halide of o-naphthoquinonediazidesulfonic acid.

Examples of the hydroxyl compound include, but are not limited to:
(1) hydroxybenzophenone compounds, for example, but not limited to, 2,3,4-trihydroxybenzophenone, 2,4,4'-trihydroxybenzophenone, 2,4,6-trihydroxybenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,5,3',5'-pentahydroxybenzophenone, and 2,3,4,3',4',5'-hexahydroxybenzophenone.
(2) hydroxyaryl compounds, for example, but not limited to, a hydroxyaryl compound represented by Formula (3):

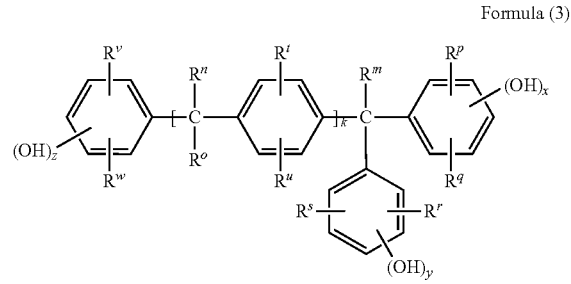

Formula (3)

wherein
$R^m$, $R^n$, and $R^o$ independently represent a hydrogen atom or a $C_1$-$C_6$ alkyl group;
$R^p$, $R^q$, $R^r$, $R^s$, $R^t$, and $R^u$ independently represent a hydrogen atom, a halogen atom, a $C_1$-$C_6$ alkyl group, a $C_1$-$C_6$ alkoxy group, a $C_1$-$C_6$ alkenyl group, or a cycloalkyl group;
$R^v$ and $R^w$ independently represent a hydrogen atom, a halogen atom, or a $C_1$-$C_6$ alkyl group;
x, y, and z independently denote an integer ranging from 1 to 3; and
k is 0 or 1.

Examples of the hydroxyaryl compound represented by Formula (3) include, but are not limited to, tri(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4- hydroxy-2,5-dimethylphenyl)-2-hydroxyphenylmethane, bis (4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenyl methane, bis(4-hydroxyphenyl)-3-methoxy-4-hydroxyphenylmethane, bis (3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl) isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene.

(3) (hydroxyphenyl)hydrocarbon compounds, for example, but not limited to, a (hydroxyphenyl)hydrocarbon compound represented by Formula (4):

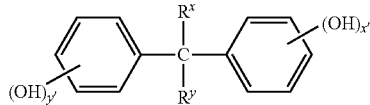

Formula (4)

Wherein
$R^x$ and $R^y$ independently represent a hydrogen atom or a $C_1$-$C_6$ alkyl group; and
x' and y' independently represent an integer ranging from 1 to 3.

Examples of the (hydroxyphenyl)hydrocarbon compound represented by Formula (b) include, but are not limited to, 2-(2,3,4-trihydroxyphenyl)-2-(2',3',4'-trihydroxyphenyl) propane, 2-(2,4-dihydroxyphenyl)-2-(2',4'-dihydroxyphenyl)propane, 2-(4-hydroxyphenyl)-2-(4'-hydroxyphenyl) propane, bis(2,3,4-trihydroxyphenyl)methane, and bis(2,4-dihydroxyphenyl)methane.

(4) other aromatic hydroxyl compounds, for example, but not limited to, phenol, p-methoxyphenol, dimethylphenol, hydroquinone, bisphenol A, naphthol, pyrocatechol, pyrogallol monomethyl ether, pyrogallol-1,3-dimethyl ether, gallic acid, and partially esterified or partially etherified gallic acid.

The aforesaid examples of the hydroxyl compounds can be used alone or as a mixture of two or more.

The preferred examples of the hydroxyl compounds include 1-[1-(4-hydroxyphenyl)isopropyl]-4-[1,1-bis(4-hydroxyphenyl)ethyl]benzene, 2,3,4-trihydroxybenzophenone, 2,3,4,4'-tetrahydroxybenzophenone, and combinations thereof.

The reaction of o-naphthoquinonediazidesulfonic acid or salt thereof with the hydroxyl compound is often conducted in an organic solvent such as dioxane, N-pyrrolidone, acetamide, and the like, in the presence of an alkali condensation agent such as triethanolamine, alkali carbonate, alkali hydrogen carbonate, and the like.

Preferably, the esterification rate of the ortho-naphthoquinone diazide sulfonic acid ester (B) is more than 50%. That is, more than 50% by mole of the hydroxyl group contained in the hydroxyl compound undergoes an esterification reaction with o-naphthoquinonediazidesulfonic acid or salt thereof, based on 100% by mole of the total hydroxyl group contained in the hydroxyl compound. More preferably, the esterification rate of the ortho-naphthoquinone diazide sulfonic acid ester (B) is more than 60%.

The quinonediazidesulfonic acid ester (B) is used in an amount ranging from 1 part by weight to 50 parts by weight, preferably from 2 parts by weight to 40 parts by weight, and more preferably from 3 parts by weight to 30 parts by weight based on 100 parts by weight of the polysiloxane (A).

The urethane(metha)acrylate compound (C) according to the invention comprises at least six (meth)acryloyl groups in one molecule. The urethane(meth)acrylate compound having at least six (meth)acryloyl groups in a molecule can be prepared by known methods. A non-limiting exemplary method for producing the urethane(meth)acrylate compound includes steps of reacting a polyol compound with a polyisocynate compound, followed by further reacting with a hydroxyl-containing (meth)acrylate compound so as to obtain the urethane(meth)acrylate compound. Alternatively, the urethane(meth)acrylate compound can be obtained by reacting the hydroxyl-containing (meth)acrylate compound with the polyisocynate compound, followed by further reacting with the polyol compound.

Preferably, the urethane(meth)acrylate compound is prepared by reacting a di-functional polyol compound with a di-functional polyisocynate compound, followed by further reacting with pentaerythritol tri(meth)acrylate. More preferably, such reaction is conducted in the presence of a catalyst. Examples of the catalyst include, but are not limited to, di-n-butyltin dilaurate and other conventional catalysts for esterification of urethane.

Examples of the hydroxyl-containing (meth)acrylate compound include, but are not limited to, 2-hydroxyethyl(meth) acrylate, hydroxymethyl(meth)acrylate, 2-hydroxypropyl (meth)acrylate, glycidol di(meth)acrylate, triglycerol di(meth)acrylate, pentaerythritol tri(meth)acrylate, dipentaerythritol penta(meth)acrylate, dipentaerythritol tetra (meth)acrylate, dipentaerythritol tri(meth)acrylate, dipentaerythritol di(meth)acrylate, trimethylolpropane di(meth) acrylate, and epoxy acrylate. The aforesaid examples of the hydroxyl-containing (meth)acrylate compound can be used alone or as a mixture of two or more. Preferably, the hydroxyl-containing (meth)acrylate compound is pentaerythritol tri(meth)acrylate.

Preferably, the polyisocyanate compound has at least two isocyanate groups in a molecule. Examples of the polyisocyanate compound include, but are not limited to, tolylene diisocyanate, diphenylmethane diisocyanate, polymethylene polyphenyl polyisocyanate, toluidine diisocyanate, naphthalene diisocyanate, hexamethylene diisocyanate, isophorone diisocyanate, xylylene diisocyanate, hydrogenated xylylene diisocyanate, and dicyclohexylmethane diisocyanate. The aforementioned examples of the polyisocyanate compound may be used alone or in a mixture of two or more.

Preferably, examples of the polyol compound include, but are not limited to, polyoxy(propylene oxide)diol, polyoxy (propylene oxide)triol, copoly(ethylene oxide-propylene oxide)diol, poly(tetramethylene oxide)glycol, ethoxylated bisphenol A, ethoxylated bisphenol S, spiro glycol, caprolactone-modified diol, carbonate diol, trimethylolpropane, and pentaerythritol. The aforementioned examples of the polyol compound may be used alone or in a mixture of two or more.

Preferably, the molecular weight of the urethane(meth) acrylate compound having at least six (meth)acryloyl groups in a molecule ranges from 1,000 to 200,000, more preferably from 1,200 to 100,000, even more preferably from 1,500 to 50,000.

The urethane(meth)acrylate compound (C) has preferably at least seven (meth)acryloyl groups in a molecule, so as to further enhance the sensitivity of the protective film thus formed.

More preferably, the urethane(meth)acrylate compound (C) has at least eight (meth)acryloyl groups in a molecule.

Commercially available products of the urethane(meth) acrylate compound (C) may include, but are not limited to:
(1) urethane(meth)acrylate compound having six (meth)acryloyl groups in a molecule: Shiko UV-7600B and Shiko UV-7605B available from Nippon Synthetic Chemical Industry Co., Ltd.; Art Resin UN-3320HA and Art Resin UN-3320HC available from Negami Industry Co., Ltd.; NK Oligo U-6HA and NK Oligo U-6LPA available from Shin-Nakamura Chemical Industry Co., Ltd.; EBECRYL 5129, EBECRYL 220, EBECRYL 8301, KRM 8200, and KRM 8200AE available from Daicel-Cytec Co., Ltd.; and Beam Set 575 and Beam Set 577 available from Toagosei Co., Ltd.,
(2) urethane(meth)acrylate compound having seven (meth) acryloyl groups in a molecule: Shiko UV-6300B available from Nippon Synthetic Chemical Industry Co., Ltd., and
(3) urethane(meth)acrylate compound having eight (meth) acryloyl groups in a molecule: Shiko UV-7610B, Shiko UV-7620EA, and Shiko UV-1700B available from Nippon Synthetic Chemical Industry Co., Ltd.; Art Resin UN-901T and Art Resin UN-3320HS available from Negami Industry Co., Ltd.); NK Oligo UA-33H and NK Oligo UA-53H available from Shin-Nakamura Chemical Industry Co., Ltd.; and KRM 8452 available from Daicel-Cytec Co., Ltd.

The aforementioned commercially available examples of the urethane(meth)acrylate compound can be used alone or in a mixture of two or more. The preferable commercially available products are Shiko UV-1700B, Shiko UV-6300B, and Shiko UV-7605B available from Nippon Synthetic Chemical Industry Co., Ltd.; NK Oligo U-6HA available from Shin-Nakamura Chemical Industry Co., Ltd.; and Art Resin UN-3320HC, Art Resin UN-3320HS and Art Resin UN-901T available from Negami Industry Co., Ltd.

The urethane(meth)acrylate compound (C) is used in a range generally from 0.1 to 35 parts by weight, preferably from 0.5 to 30 parts by weight, and more preferably from 1 to 25 parts by weight based on 100 parts by weight of the polysiloxane.

If the urethane(meth)acrylate compound (C) is not included in the photosensitive polysiloxane composition according to the invention, the film produced thereby has the problem of unsatisfactory sensitivity. Without limited by theory, it is believed that due to the low-molecular-weighted compound added to the photo resist, the effect of the developing is increased.

The Group IV element oxide is a main component of the inorganic particles (D) according to the invention. By adding the inorganic particles (D) with high refractive rate, the refractivity of the film produced with the photosensitive polysiloxane composition is raised.

In one embodiment of the invention, the particle size of the inorganic particles (D) is from 1 nm to 100 nm; preferably from 1 nm to 50 nm; more preferably from 5 nm to 15 nm. Method for measuring the particle size may be a known one such as a method by dynamic light scattering. If the particle size is less than 1 nm, secondary aggregation and whiting easily occur in the film obtained thereby; if the particle size is greater than 100 nm, uniformity of the surface of the film may be affected.

In one embodiment of the invention, the oxide suitable for the inorganic particles (D) is preferably titanium oxide, zirconium oxide, hafnium oxide and composite particles formed by the said metal oxide and silicon oxide and tin oxide. The refractivity of the resulting film increases. More preferably, the oxide is titanium oxide and zirconium oxide; i.e. the group IV element is more preferably titanium or zirconium.

In another aspect, the two crystalline forms, anatase and rutile coexist in titanium oxide. Preferably, the crystalline form is rutile type, which has high refractivity and excellent light resistance.

Furthermore, since titanium oxide having a photocatalytic activity, it is difficult to be applied in the optical field. Preferably, the particle surface of titanium oxide is covered by silicon oxide.

According to the present invention, the inorganic particles (D) may be in powder form or dispersed sol form where the oxide particles are dispersed in a dispersion medium. Examples of the dispersion medium are methanol, methyl ethyl ketone, methyl isobutyl ketone, cyclohexanone, N-methyl-2-pyrrolidone, propylene glycol monomethyl ether, ethoxyethanol.

In one embodiment of the invention, the commercially available titanium oxide particles are NanoTek $TiO_2$ made by Japan CI Kasei (dispersion medium is methyl isobutyl ketone, anatase type); Korea NanoCMS system, Lot No.: S111109 (dispersion medium is ethoxyethanol, rutile type); Red Lake series made by JGC Shokubai Kasei, Japan (dispersion medium is methanol, anatase type); TS series made by Tayca (dispersion medium is methyl ethyl ketone, rutile type). Commercially available zirconium oxide particles are HXU-120JC made by Japan Osaka Cement Co. (dispersion medium is methyl ethyl ketone).

In one embodiment of the invention, the amount of the inorganic particles (D) used is from 5 to 120 parts by weight; preferably from 10 to 100 parts by weight; more preferably from 20 to 70 parts by weight based on 100 parts by weight of the polysiloxane polymer (A) used. If the amount of the inorganic particles (D) used is less than 5 parts by weight, the refractivity of the film obtained thereby is not satisfactory; if the amount of the inorganic particles (D) used is greater than 120 parts by weight, the development is not satisfactory.

There is no specific limitation to the solvent (E) suitable in the photosensitive polysiloxane composition of the present invention, as long as each component can be completely dissolved, and the solvent has a high volatility at atmospheric pressure and can be evaporated with only small amount of heat. Examples of the solvent (E) include, but are not limited to, an alcoholic hydroxyl-containing compound, and a carbonyl-containing cyclic compound. The aforesaid examples of solvent (E) can be used alone or as a mixture of two or more.

Examples of the alcoholic hydroxyl-containing compound include, but are not limited to, acetol, 3-hydroxy-3-methyl-2-butanone, 4-hydroxy-3-methyl-2-butanone, 5-hydroxy-2-pentanone, 4-hydroxy-4-methyl-2-pentanone (diacetone alcohol, abbreviated as DAA), ethyl lactate, butyl lactate, propylene glycol monomethyl ether, propylene glycol monoethyl ether (abbreviated as PGEE), propylene glycol monomethylether acetate (abbreviated as PGMEA), propylene glycol mono-n-propyl ether, propylene glycol mono-n-butyl ether, propylene glycol mono-t-butyl ether, 3-methoxy-1-butanol, 3-methyl-3-methoxy-1-butanol, and combinations thereof. The aforesaid examples of the alcoholic hydroxyl-containing compound can be used alone or as a mixture of two or more.

Preferably, the alcoholic hydroxyl-containing compound is selected from diacetone alcohol, ethyl lactate, propylene glycol monoethyl ether, propylene glycol monomethylether acetate, and combinations thereof.

Examples of the carbonyl-containing cyclic compound include, but are not limited to, γ-butyrolactone, γ-valerolactone, δ-valerolactone, propylene carbonate, N-methylpyrrolidone, cyclohexanone, and cycloheptanone. The aforesaid examples of the carbonyl-containing cyclic compound can be used alone or as a mixture of two or more.

Preferably, the carbonyl-containing cyclic compound is selected from γ-butyrolactone, N-methylpyrrolidone, cyclohexanone, and combinations thereof.

When the alcoholic hydroxyl-containing compound and the carbonyl-containing cyclic compound are used in combination, there is no specific limitation to the weight ratio thereof. The weight ratio of the alcoholic hydroxyl-containing compound to the carbonyl-containing cyclic compound ranges preferably from 99/1 to 50/50, and more preferably from 95/5 to 60/40. It should be noted that, when the weight ratio of the alcoholic hydroxyl-containing compound to the carbonyl-containing cyclic compound ranges from 99/1 to 50/50, it is less likely for the unreactive silanol group in the polysiloxane polymer (A) to undergo condensation reaction that may reduce the storage stability. Moreover, the miscibility between the polysiloxane polymer (A) and the ortho-naphthoquinone diazide sulfonic acid ester (B) is good so that it is less likely to opaque the protective film, thereby maintaining the transparency of the protective film formed thereby.

Further solvents other than the aforesaid solvent can be included in the photosensitive polysiloxane composition of the present invention as long as the desirable effects obtainable by the photosensitive polysiloxane composition are not impaired. Examples of the further solvents include, but are not limited to: (1) esters, for example, ethyl acetate, n-propyl acetate, isopropyl acetate, n-butyl acetate, isobutyl acetate, propylene glycol monomethyl ether acetate, 3-methoxy-1-butyl acetate, 3-methyl-3-methoxy-1-butyl acetate, and the like; (2) ketones, for example, methyl isobutyl ketone, diisopropyl ketone, diisobutyl ketone, and the like; (3) ethers, for example, diethyl ether, diisopropyl ether, di-n-butyl ether, diphenyl ether, and the like.

Preferably, the solvent (E) is used in an amount ranging generally from 50 parts by weight to 2,000 parts by weight, preferably from 100 parts by weight to 1,900 parts by weight, and more preferably from 200 parts by weight to 1,800 parts by weight based on 100 parts by weight of polysiloxane polymer (A).

Preferably, the photosensitive resin composition according to the present invention can contain other additives according to the specific requirements for the physical and/or chemical properties. The additives can be chosen by skilled artisans in the field. Examples of the additives are fillers, polymers other than the polysiloxane polymer (A), UV absorbents, anti-coagulants, surfactants, adhesion improving agents, storage stabilizers, heat resistance improving agents, curing improving agents and combinations thereof.

In one preferred embodiment of the invention, the fillers are glass, aluminum fillers.

The polymers other than the polysiloxane polymer (A) are polyvinyl alcohol, polyglycol monoether, and polyacrylate fluoride.

Examples of the UV absorbents are 2-(3-t-butyl-5-methyl-2-hydroxyphenyl)-5-chlorobenzotriazole, or alkoxybenzophenone.

The anti-coagulants include but are not limited to sodium polyacrylate.

The surfactants can improve the coating of the composition according to the invention. In one embodiment of the invention, the surfactants include a fluorine-based surfactants or silicone-based surfactants.

Specific examples of the fluorine-based surfactants include fluorine-based surfactants formed of compounds respectively having a fluoroalkyl or fluoroalkylene group at least at any of the ends. In one embodiment of the invention, the fluorine-based surfactants include 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, sodium fluoroalkylbenzene sulfonate, sodium fluoroalkyl phosphate, sodium fluoroalkyl carboxylate, fluoroalkyl polyoxyethylene ether, diglycerin tetra(fluoroalkyl polyoxyethylene ethers), fluoroalkyl ammonium iodide, fluoroalkyl betaine, fluoroalkyl polyoxyethylene ethers, perfluoroalkyl polyoxyethylene ether, and perfluoroalkyl alkanol. In one another embodiment of the invention, the fluorine-based surfactants include BM-1000, BM-1100 (manufactured by BM CHEMIE), Megafac® F142D, F172, F173, F183, F178, F191, F471 and F476 (manufactured by Dainippon Ink and Chemical Industries, Ltd.), Fluorad® FC-170C, FC-171, FC-430, FC-431 (manufactured by Sumitomo chemical), chlorofluorocarbons S-112, S-113, S-131, S-141, S-145, S-382, SC-101, SC-102, SC-103, SC-104, SC-105, SC-106 (manufactured by Asahi Glass Company), F TOP EF301, 303, 352 (manufactured by Shin Akita Chemical Co., Ltd), FTERGENT FT-100, FT-110, FT-140A, FT-150, FT-250, FT-251, FTX-251, FTX-218, FT-300, FT-310, FT-400S (manufactured by NEOSU Ltd.)

Examples of the silicone-based surfactants are TORE silicone DC3PA DC7PA, SH11PA, SH21PA, SH28PA, SH29PA, SH30PA, SH-190, SH-193, SZ-6032, SF-8427, SF-8428, DC-57, DC-190 (manufactured by Dow Corning Toray Silicone), TSF-4440, TSF-4300, TSF-4445, TSF-4446, TSF-4460, TSF-4452 (manufactured by GE Toshiba silicone).

In addition to said fluorine-based surfactants or silicone-based surfactants, the surfactant refers to (1) polyoxyethylene alkyl ethers, such as lauryl alcohol polyoxyethylene, polyoxyethylene stearic acid ether and polyoxyethylene oleyl ether; (2) polyoxyethylene aryl ethers, such as polyoxyethylene n-octyl phenyl ether and polyoxyethylene n-nonylphenol ether; (3) polyoxyethylene dialkyl esters, such as polyoxyethylene dilaurate and polyoxyethylene distearate; (4) nonionic surfactants, such as KP341 (manufactured by Shin-Etsu Chemical), poly Flow No. 57, 95 (manufactured by Kyoeisha Yushi Chemical Industries, Ltd.).

The aforesaid examples of surfactants can be used alone or in admixture of two or more thereof.

The adhesion improving agents are able to improve the adhesive force of the substrate, and preferably the adhesion improving agents are functional silane crosslinking agents. Preferably, the functional silane crosslinking agents include a carboxyl, alkenyl, isocyanate, epoxy group, amino, sulfhydryl group or halogen. Examples are as follows: p-hydroxyphenyltrimethoxy silane, 3-(meth)acroxy propyl trimethoxysilane, vinyl triacetoxylsilane, vinyl trimethoxysilane, vinyl triethoxysilane, vinyl tri(2-methoxylethoxy)silane, γ-isocyanate propyl triethoxysilane, 3-glycidoxy propyl trimethoxysilane (such as KBM403 manufactured by Shin-Etsu Chemical), 2-(3,4-epoxy cyclohexane) ethyl trimethoxysilane, 3-glycidoxy propyl dimethyl methoxysilane, 3-aminopropyl trimethoxysilane, N-(2-aminoethyl)-3-aminopropyl trimethoxysilane, N-(2-aminoethyl)-3-aminopropyl methyl dimethoxysilane, 3-mercaptopropyl trimethoxysilane, 3-chloropropyl trimethoxysilane and 3-chloropropyl methyl dimethoxysilane. Those adhesion improving agents can be used independently or mixedly.

The storage stabilizers can be sulphur, quinone, hydroquinone, poly oxide, amine, nitroso compounds or Nitro compounds. Examples are as follows: 4-methoxyphenol, (N-mitroso-N-phenyl) hydroxylamino aluminum, 2,2-thiobis(4-methyl-6-tert-butylphenol) and 2,6-di-tert-butylphenol.

The heat resistance improving agents can be to N-(alkoxy methyl)glycoluril compounds and N-(alkoxy methyl) melamine Examples of said N-(alkoxy methyl)glycoluril compounds are as follows: N,N,N',N'-tetra(methoxy methyl) glycoluril, N,N,N',N'-tetra(ethyoxyl methyl)glycoluril, N,N,N',N'-tetra(n-propoxy methyl)glycoluril, N,N,N',N'-tetra (isopropoxy methyl)glycoluril, N,N,N',N'-tetra(n-butoxy methyl)glycoluril and N,N,N',N'-tetra(tert-butoxy methyl)glycoluril, and preferably N,N,N',N'-tetra(methoxy methyl) glycoluril. Examples of said N-(alkoxy methyl) melamine are as follows: N,N,N',N',N'',N''-hexa(methoxy methyl) melamine, N,N,N',N',N'',N''-hexa(ethyoxyl methyl) melamine, N,N,N',N',N'',N''-hexa(n-propoxy methyl) melamine, N,N,N',N',N'',N''-hexa(isopropoxy methyl) melamine, N,N,N',N',N'',N''-hexa(n-butoxy methyl) melamine, and N,N,N',N',N'',N''-hexa(tert-butoxy methyl) melamine, and preferably N,N,N',N',N'',N''-hexa(methoxy methyl) melamine Commercialized products are such as NIKARAKKU N-2702 and MW-30M (manufactured by SANHE CHEMICALS CO. LTD).

The curing improving agents include, but are not limited to: (1) the epoxy group-containing compounds, for example, but not limited to, bisphenol A diglycidyl ether, bisphenol F diglycidyl ether, bisphenol S diglycidyl ether, hydrogenated bisphenol A diglycidyl ether, hydrogenated bisphenol F diglycidyl ether, hydrogenated bisphenol AD diglycidyl ether, brominated bisphenol A diglycidyl ether, brominated bisphenol F diglycidyl ether, brominated bisphenol S diglycidyl ether of bisphenol diglycidyl ether compounds; (2) guanamine compounds, for example, but not limited to, melamine, guanidine amine, acetoguanamin, and benzoguanamine; (3) amine compounds, such as, but not limited to, dicyandiamide, benzyl dimethyl amine, 4-(dimethylamino)-N,N-dimethyl benzyl amine, 4-methoxy-N,N-dimethyl benzyl amine, and 4-methyl-N,N-dimethyl benzyl amine; and (4) imidazole derivatives and salts thereof, for example, but not limited to, imidazole, 2-methylimidazole, 2-ethyl-imidazole, 2-ethyl-4-methylimidazole, 2-phenyl imidazole, 4-phenyl imidazole, 1-cyanoethyl-2-phenyl imidazole, and 1-(2-cyanoethyl)-2-ethyl-4-methylimidazole.

The amount of the additives (F) according to the invention can be chosen by skilled artisans in this field. Preferably, The additives (F) are used in an amount ranging generally from 0 to 30 parts by weight, preferably from 0 to 25 parts by weight, and more preferably from 0 to 20 parts by weight, based on 100 parts by weight of the polysiloxane polymer (A).

The photosensitive polysiloxane composition of the present invention is manufactured by stirring the polysiloxane polymer (A), the ortho-naphthoquinone diazide sulfonic acid ester (B), the urethane(metha)acrylate compound (C), the inorganic particles (D), and the solvent (E) optionally together with the additives (F) in a stirrer to form a homogeneous solution.

The present invention also provides a method for forming a film on a substrate comprising applying the photosensitive polysiloxane composition as mentioned above on the substrate.

The present invention also provides a film on a substrate, which is obtained by the method as mentioned above.

Preferably, the film according to the invention is a planarization film of a TFT substrate in a liquid crystal display element or organic light-emitting display device, an interlayer insulating film or an overcoat of a core material or a protective material in a waveguide.

In one embodiment of the invention, the film of the present invention is formed by coating the photosensitive polysiloxane composition onto a substrate followed by pre-bake, exposure, development, and post-bake treatments.

The photosensitive polysiloxane composition is not limited, and can be applied on the substrate by spin coating, slit coating, roller coating, or the like, and is then prebaked to remove the solvent and to form a prebaked coating film. The conditions for the prebaking depend on the types and the formulating ratio of the components for the photosensitive polysiloxane composition. However, the prebaking is usually conducted at a temperature ranging from 60° C. to 110° C. for a period ranging from 30 seconds to 15 minutes. Preferably, the thickness of the film is from 3 to 6 μm.

The prebaked coating film is exposed via a photomask using ultraviolet light, far ultraviolet light, X-rays, charged particle beam. Ultraviolet light is such as g-line (wavelength of 436 nm), h-line, i-line (wavelength of 365 nm) Far ultraviolet light is such as KrF excimer laser; X-rays is such as synchrotron radiation; charged particle beam is such as electron beam. Preferably, the light is ultraviolet light, more preferably the g-line or i-line. The device for providing the ultraviolet light includes a (ultra-) high pressure mercury lamp, and a metal halide lamp. Preferably, the exposure is 50 to 1500 J/m$^2$.

The prebaked coating film after exposing is immersed in a developer solution for a period ranging from 30 seconds to 2 minutes so as to form a desired pattern. Examples of the developer include (1) alkali compounds, such as sodium hydroxide, potassium hydroxide, sodium carbonate, sodium hydrogen carbonate, potassium carbonate, potassium hydrogen carbonate, sodium silicate, sodium methylsilicate, aqueous ammonia; (2) primary amine, such as ethylamine, n-propylamine; (3) secondary amine, such as diethylamine, di-n-propylamine; (4) aliphatic tertiary amines, such as trimethylamine, diethylmethylamine, dimethyl ethyl amine, and triethylamine; (5) alicyclic tertiary acids, such as pyrrole, piperidine, N-methyl piperidine, N-methyl-1,8-diazabicyclo [5.4.0]-7-undecene, and 1,5-diazabicyclo[4.3.0]-5-nonene; (6) aromatic tertiary amines, such as pyridine, pyrimidine, lutidine, and quinoline; and (7) quaternary ammonium salt basic compounds such as the aqueous solution of tetramethylammonium hydroxide, tetraethylammonium hydroxide.

In addition, the water-soluble organic solvents and/or surfactants, such as methanol, ethanol, may be added as needed in the developer solution. Further, the developing method maybe, for example, but not limited to, fluid collection method, dipping method, vibration dipping, rinsing, and other appropriate methods.

The basic developer solution is removed by washing with water after developing. The coating film formed on the substrate is dried with compressed air or nitrogen. Preferably, the film is subjected to a post-exposure treatment using a high-pressure mercury lamp. The coating film overall is irradiated, and the residue of ortho-naphthoquinone diazide sulfonic acid ester (B) is decomposed. More preferably, the post-exposure in the exposure step is 2000 to 5000 J/m².

The film is then post-baked using a heating device, such as a hot plate or an oven. The post-baking is conducted at a temperature ranging from 120° C. to 250° C. for a period ranging from 5 minute to 30 minutes if the hot plate is used or for a period ranging from 30 minutes to 90 minutes if the oven is used. A film is formed on the substrate after the aforementioned process.

Examples of the substrate suitable for the present invention include alkali-free glass, soda-lime glass, Pyrex glass, quartz glass, a glass coated with a transparent conductive film thereon, and the like commonly used in a liquid crystal display; and a photoelectric conversion substrate (for example, a silicon substrate) used in a solid-state image sensor.

The present invention further provides an apparatus comprising the film as mentioned above.

The apparatus according to the invention includes but is not limited to a display device, a semiconductor device, an optical waveguide device, and the like.

The following examples are given for the purpose of illustration only and are not intended to limit the scope of the present invention.

Example

Preparation of Polysiloxane Polymer (A-1)

A 500 ml three-necked flask was added with 200 g of propylene glycol monoethyl ether (hereafter as PGEE). The silane compound/siloxane prepolymer solution and oxalic acid as shown in Table 1 were continually added with stirring at room temperature. The mixture in the flask was then stirred in an oil bath at a temperature of 30° C. for 30 minutes. The temperature of the oil bath was raised to 120° C. within a succeeding 30 minutes. After the inner temperature reached 105° C., the mixture in the flask was further stirred and heated for 6 hours to obtain the polysiloxane polymer (A-1).

Preparations of Polysiloxane Polymers (A-2) to (A-4)

The preparations of polysiloxane polymers (A-2) to (A-4) are similar to the preparation of polysiloxane (A-1), and the kind and amount of the silane compound/siloxane prepolymer were as shown in Table 1. The amount of oxalic acid, reaction temperature and the reaction time of the polycondensation differed from those of the preparation of polysiloxane polymer (A-1) and were also shown in Table 1, and polysiloxane polymers (A-2) to (A-4) were obtained.

TABLE 1

Contents of preparation of polysiloxane polymer(A-1)

| | Composition | | | | | | | | | | | Catalyst(g) | | |
|---|---|---|---|---|---|---|---|---|---|---|---|---|---|---|
| | Silane Compound/Siloxane prepolymer (mol) | | | | | | | | solvent(g) | | | Oxalic | Temp. | Time |
| Preparation | MTMS | DMDMS | PTMS | PTES | GF-20 | TMSG | TMSOX | DMS-S27 | PGEE | DAA | water | acid | (° C.) | (hour) |
| A-1 | 0.30 | | 0.65 | | 0.05 | | | | 200 | | 75 | 0.40 | 105 | 6 |
| A-2 | | 0.40 | 0.40 | 0.20 | | | | | 100 | 100 | 75 | 0.40 | 110 | 5 |
| A-3 | | 0.60 | 0.35 | | | 0.05 | | | 200 | | 75 | 0.35 | 105 | 6 |
| A-4 | 0.65 | | | 0.25 | | | 0.09 | 0.01 | 200 | | 75 | 0.45 | 110 | 6 |

MTMS: Methyltrimethoxysilane
DMDMS: Dimethyldimethoxysilane
PTMS: Phenyltrimethoxysilane
PTES: Phenyltriethoxysilane
GF-20: 3-(triethoxysilyl)propyl succinic anhydride
TMSG: 3-trimethoxysilylpropyl glutaric anhydride
TMSOX-D: 3-ethyl-3-[[3-(trimethoxysilyl)propoxy)methyl] oxetane
DMS-S27: manufactured by Gelest
PGEE: Propylene glycol monoethyl ether
DAA: Diacetone alcohol

Examples of Photosensitive Polysiloxane Composition

The compositions and amounts shown in Table 2 were mixed and dissolved using a shaker to obtain a photosensitive polysiloxane composition.

Comparative Examples of Photosensitive Polysiloxane Composition

The compositions and amounts shown in Table 2 were mixed and dissolved using a shaker to obtain a photosensitive polysiloxane composition.

Formation of OG-Protected Positive Photoresist

The photosensitive polysiloxane compositions of the examples and comparative examples were spin-coated on a glass substrate (100 mm×100 mm×0.7 mm) with a thickness of 2 μm. The films were pre-baked at a temperature of 110° C. for 2 minutes. A positive photoresist mask was placed between the exposure machine and the coating films and the films were irradiated with ultraviolet irradiation of 100 mJ/cm². After exposure, the films were then immersed in the 2.38% of tetramethylammonium hydroxide solution for 60 seconds at 23° C. The exposed parts of the coating films on the substrate was removed, and then washed with pure water. The films after development were irradiated with 200 mJ/cm². After exposure, the films were post-baked for 60 minutes at 230° C. to obtain the protective film on the glass.

Assays
1. Sensitivity

The photosensitive polysiloxane compositions of the examples and comparative examples were spin-coated on a glass substrate (100 mm×100 mm×0.7 mm) with a thickness of 2 μm. The films were pre-baked at a temperature of 110° C. for 2 minutes. A positive photoresist mask with patterns having different line widths was placed between the exposure machine and the coating films and the films were irradiated. After exposure, the films were then immersed in the 2.38% of tetramethylammonium hydroxide solution for 60 seconds at 23° C. The exposure energy for forming the line width of 1 μm was observed.

◎: exposure energy≤150 mJ/cm$^2$
○: 150 mJ/cm$^2$≤exposure energy<300 mJ/cm$^2$
X: 300 mJ/cm$^2$≤exposure energy 2. Refractivity The refractivity of the protective film on the glass as mentioned above was assayed with the optical film thickness machine (MFS-630-F, Hong-Ming Technology Co. Ltd). The criteria are as follows.

○: refraction rate≥1.6
Δ: 1.6≥refraction rate 1.5
X: 1.5>refraction rate

The results of development are shown in Table 2. It shows that the sensitivity and refractivity of the films comprising the urethane(metha)acrylate compound (C) and inorganic particles (D).

TABLE 2

| Components | | Examples | | | | | | | | Comparative Examples | | | |
|---|---|---|---|---|---|---|---|---|---|---|---|---|---|
| | | 1 | 2 | 3 | 4 | 5 | 6 | 7 | 8 | 1 | 2 | 3 | 4 |
| polysiloxane polymer (A) (parts by weight) | A-1 | 100 | | | | 50 | | | | 100 | | | |
| | A-2 | | 100 | | 30 | 50 | | 100 | | | 100 | | |
| | A-3 | | | 100 | | 70 | 100 | | | | | 100 | |
| | A-4 | | | | 100 | | | | | | | | 100 |
| ortho-naphthoquinone diazide sulfonic acid ester (B) (parts by weight) | B-1 | 5 | 10 | | 15 | 20 | 20 | 10 | 40 | 20 | 15 | 10 | |
| | B-2 | | | 15 | 5 | | 10 | 5 | | | | 5 | 20 |
| urethane (metha)acrylate compound (C)(parts by weight) | C-1 | 0.1 | | | | | 5 | | 25 | | | 5 | |
| | C-2 | | | | | 15 | | 5 | | | | | |
| | C-3 | | | 5 | | | | | | | | | |
| | C-4 | | 1 | | | | | 30 | | | | | |
| | C-5 | | | | | 10 | 10 | | | | | | |
| urethane (metha)acrylate compound comprising two (meth)acryloyl groups in one molecule(parts by weight) | C-6 | | | | | | | | | | 15 | | |
| inorganic particles (D)(parts by weight) | D-1 | 5 | | | | 70 | | 120 | | 50 | | | |
| | D-2 | | 20 | | 60 | 10 | 100 | | 30 | | | | |
| | D-3 | | | 40 | | | | | | | 50 | | |
| Solvent (E) (parts by weight) | E-1 | 50 | 500 | 500 | 500 | 800 | 1200 | 1000 | 800 | 800 | 600 | 600 | 800 |
| | E-2 | | | 300 | | 200 | | 800 | | | | | |
| | E-3 | | | | 300 | | | | | | 200 | | |
| Additives (F)(parts by weight) | F-1 | | | | 0.5 | | | 1 | | | | | |
| | F-2 | 2 | | | | | | | | | | | |
| Assays | Sensitivity | ○ | ◎ | ◎ | ◎ | ◎ | ◎ | ◎ | ○ | X | X | ○ | X |
| | Refractivity | ○ | ○ | ○ | ○ | ○ | ○ | ○ | ○ | ○ | ○ | X | X |

B-1: ortho-naphthoquinone diazide sulfonic acid ester compound obtained by reacting 1-[1-(4-hydroxyphenyl)isopropyl]-4-[1,1-bis(4-hydroxyphenyl)ethyl]benzene with o-naphthoquinonediazo-5-sulfonic acid;
B-2: ortho-naphthoquinone diazide sulfonic acid ester compound obtained by reacting 2,3,4-trihydroxybenzophenone with o-naphthoquinonediazo-5-sulfonic acid
C-1: NK Oligo U-6HA manufactured by Shin-Nakamura Chemical Industry Co., Ltd.
C-2: Shiko UV-1700B manufactured by Nippon Synthetic Chemical Industry Co., Ltd.
C-3: Shiko UV-6300B manufactured by Nippon Synthetic Chemical Industry Co., Ltd.
C-4: Art Resin UN-901T manufactured by Negami Industry Co., Ltd.
C-5: Art Resin UN-3320HS manufactured by Negami Industry Co., Ltd.
C-6: Art Resin UN-9000PEP manufactured by Negami Industry Co., Ltd., comprising two (meth)acryloyl groups in one molecule
D-1: $TiO_2$, average particle size of 13.14 nm, manufactured by Korea NanoCMS system
D-2: $TiO_2$, average particle size of 24.23 nm, manufactured by Japan CI Kasei
D-3: $ZrO_2$, average particle size of 17.46 nm, manufactured by Osaka Cement Co., Ltd.
E-1: propylene glycol monomethylether acetate (abbreviated as PGMEA)
E-2: 4-hydroxy-4-methyl-2-pentanone (abbreviated as DAA)
E-3: cyclohexanone
F-1: SF-8427, manufactured by Toray Dow Corning Silicon (surfactant)
F-2: KBM403, manufactured by Shin-Etsu Chemical (3-epoxy propoxy propyl trimethoxysilane)

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. A photosensitive polysiloxane composition comprising:
a polysiloxane polymer (A);
an ortho-naphthoquinone diazide sulfonic acid ester (B);
an urethane(metha)acrylate compound (C), wherein the urethane(metha)acrylate compound (C) comprises at least six (meth)acryloyl groups in one molecule;
inorganic particles (D), wherein the Group IV element oxide is a main component of the inorganic particles (D); and
a solvent (E).

2. The photosensitive polysiloxane composition according to claim 1, wherein the urethane(metha)acrylate compound (C) comprises at least seven (meth)acryloyl groups in one molecule.

3. The photosensitive polysiloxane composition according to claim 1, wherein the urethane(metha)acrylate compound (C) comprises at least eight (meth)acryloyl groups in one molecule.

4. The photosensitive polysiloxane composition according to claim 1, wherein the amount of the ortho-naphthoquinone diazide sulfonic acid ester (B) used is from 1 to 50 parts by weight; the amount of the urethane(metha)acrylate compound (C) used is from 0.1 to 35 parts by weight; the amount of the inorganic particles (D) used is from 5 to 120 parts by weight; and the amount of the solvent (E) used is from 50 to 2,000 parts by weight based on 100 parts by weight of the polysiloxane polymer (A) used.

5. The photosensitive polysiloxane composition according to claim 1, wherein the polysiloxane polymer (A) is obtained by hydrolyzing and condensing a silane compound represented by Formula (1);

$$\text{Si}(R^a)_t(OR^b)_{4-t} \qquad \text{Formula (1)}$$

wherein
$R^a$ is independently selected from the group consisting of a hydrogen atom, a $C_1$-$C_{10}$ alkyl group, a $C_2$-$C_{10}$ alkenyl group, and a $C_6$-$C_{15}$ aryl group, an anhydride-substituted $C_1$-$C_{10}$ alkyl group, and an epoxy-substituted alkoxy group;
$R^b$ is independently selected from the group consisting of a hydrogen atom, a $C_1$-$C_6$ alkyl group, a $C_1$-$C_6$ acyl group, and a $C_6$-$C_{15}$ aryl group; and
t represents an integer from 0 to 3, and wherein when t is 2 or 3, the plural $R^a$s are identical with or different from each other; and wherein when 4-t is 2 or 3, the plural $R^b$s are identical with or different from each other.

6. The photosensitive polysiloxane composition according to claim 1, wherein the Group IV element in the inorganic particles (D) is titanium or zirconium.

7. The photosensitive polysiloxane composition according to claim 1, wherein the particle size of the inorganic particles (D) is from 1 nm to 100 nm.

8. A method for forming a film on a substrate comprising applying the photosensitive polysiloxane composition according to claim 1 on the substrate.

9. The method according to claim 8, wherein the urethane (metha)acrylate compound (C) comprises at least seven (meth)acryloyl groups in one molecule.

10. The method according to claim 8, wherein the urethane (metha)acrylate compound (C) comprises at least eight (meth)acryloyl groups in one molecule.

11. The method according to claim 8, wherein the amount of the ortho-naphthoquinone diazide sulfonic acid ester (B) used is from 1 to 50 parts by weight; the amount of the urethane(metha)acrylate compound (C) used is from 0.1 to 35 parts by weight; the amount of the inorganic particles (D) used is from 5 to 120 parts by weight; and the amount of the solvent (E) used is from 50 to 2,000 parts by weight based on 100 parts by weight of the polysiloxane polymer (A) used.

12. The method according to claim 8, wherein the polysiloxane polymer (A) is obtained by hydrolyzing and condensing a silane compound represented by Formula (1);

$$\text{Si}(R^a)_t(OR^b)_{4-t} \qquad \text{Formula (1)}$$

wherein
$R^a$ is independently selected from the group consisting of a hydrogen atom, a $C_1$-$C_{10}$ alkyl group, a $C_2$-$C_{10}$ alkenyl group, and a $C_6$-$C_{15}$ aryl group, an anhydride-substituted $C_1$-$C_{10}$ alkyl group, and an epoxy-substituted alkoxy group;
$R^b$ is independently selected from the group consisting of a hydrogen atom, a $C_1$-$C_6$ alkyl group, a $C_1$-$C_6$ acyl group, and a $C_6$-$C_{15}$ aryl group; and
t represents an integer from 0 to 3, and wherein when t is 2 or 3, the plural $R^a$s are identical with or different from each other; and wherein when 4-t is 2 or 3, the plural $R^b$s are identical with or different from each other.

13. The method according to claim 8, wherein the Group IV element in the inorganic particles (D) is titanium or zirconium.

14. The method according to claim 8, wherein the particle size of the inorganic particles (D) is from 1 nm to 100 nm.

15. A film on a substrate, which is obtained by the method according to claim 8.

16. The film according to claim 15, which is a planarization film of a TFT substrate in a liquid crystal display element or organic light-emitting display device, an interlayer insulating film or an overcoat of a core material or a protective material in a waveguide.

17. An apparatus comprising the film according to claim 15.

18. The apparatus according to claim 17, wherein the film is a planarization film of a TFT substrate in a liquid crystal display element or organic light-emitting display device, an interlayer insulating film or an overcoat of a core material or a protective material in a waveguide.

* * * * *